United States Patent
Jo et al.

(10) Patent No.: US 10,740,226 B2
(45) Date of Patent: Aug. 11, 2020

(54) MEMORY DEVICE, MEMORY SYSTEM, AND OPERATION METHOD THEREOF

(71) Applicant: SK hynix Inc., Gyeonggi-do (KR)

(72) Inventors: Sang-Gu Jo, Gyeonggi-do (KR); Jung-Hyun Kwon, Seoul (KR); Sung-Eun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 197 days.

(21) Appl. No.: 15/793,007

(22) Filed: Oct. 25, 2017

(65) Prior Publication Data

US 2018/0210826 A1 Jul. 26, 2018

(30) Foreign Application Priority Data

Jan. 23, 2017 (KR) .................. 10-2017-0010342

(51) Int. Cl.
| | |
|---|---|
| *G06F 12/02* | (2006.01) |
| *G06F 11/10* | (2006.01) |
| *G06F 3/06* | (2006.01) |
| *G11C 16/34* | (2006.01) |
| *G11C 29/00* | (2006.01) |
| *G11C 29/52* | (2006.01) |

(52) U.S. Cl.
CPC ........ *G06F 12/0246* (2013.01); *G06F 3/0619* (2013.01); *G06F 11/1004* (2013.01); *G06F 11/1048* (2013.01); *G11C 16/3495* (2013.01); *G11C 29/52* (2013.01); *G11C 29/88* (2013.01); *G06F 2212/7204* (2013.01)

(58) Field of Classification Search
CPC ......... G06F 12/0246; G06F 2212/7201; G06F 2212/7208; G06F 3/0679; G06F 3/064; G06F 3/0659; G06F 3/0619; G06F 3/0688
USPC .............. 714/6.13, 6.2, 6.21, 6.22, 6.32, 6.1
See application file for complete search history.

(56) References Cited

U.S. PATENT DOCUMENTS

| | | | |
|---|---|---|---|
| 8,732,519 B2 | 5/2014 | Sun et al. | |
| 2008/0181015 A1* | 7/2008 | Lee ..................... | G11C 11/5621 365/185.22 |
| 2009/0210616 A1* | 8/2009 | Karamcheti ............ | G11C 5/04 711/105 |
| 2011/0231732 A1* | 9/2011 | Chu ..................... | G06F 11/1048 714/763 |
| 2015/0134889 A1* | 5/2015 | Zhong ..................... | G06F 13/28 711/103 |
| 2016/0034343 A1* | 2/2016 | Yeh ..................... | G06F 11/1048 714/758 |
| 2017/0330635 A1* | 11/2017 | Shepard ................. | G11C 29/76 |
| 2018/0181476 A1* | 6/2018 | Gunnam ............. | G06F 11/2094 |

* cited by examiner

*Primary Examiner* — Jigar P Patel
(74) *Attorney, Agent, or Firm* — IP & T Group LLP (57) ABSTRACT

A memory device is provided. The memory device includes a plurality of normal memory blocks; and at least two or more bad memory blocks, wherein data having the same number of bits as data to be stored in a normal memory block and a parity code having the number of bits at least twice greater than that of a parity code to be stored in the normal memory block are stored in a first bad memory block and a second bad memory block among the bad memory blocks.

5 Claims, 5 Drawing Sheets

| BMB |
|-----|
| 2 |
| 7 |
| 11 |
| 12 |
|  |

FIG. 5

| LMB | PMB | Valid |
|-----|-----|-------|
| 0 | 1 | 1 |
| 1 | 3 | 1 |
| 2 | 8 | 1 |
| 3 | 0 | 1 |
| 4 | 5 | 1 |
| 5 | 4 | 1 |
| 6 | 6 | 1 |
| 7 |   | 0 |
| 8 | 10 | 1 |
| 9 | 9 | 1 |

FIG. 6

| LMB | PMB | Valid |
|-----|-----|-------|
| 7   | 2, 7 | 1    |
|     |     | 0     |

MEMORY DEVICE, MEMORY SYSTEM, AND OPERATION METHOD THEREOF

CROSS-REFERENCE TO RELATED APPLICATIONS

The present application claims priority of Korean Patent Application No. 10-2017-0010342, filed on Jan. 23, 2017, which is incorporated herein by reference in its entirety.

TECHNICAL FIELD

This patent document relates to a memory device, a memory system including the memory device, and an operation method thereof.

BACKGROUND

The number of write operations which can be performed on a single memory cell of a memory device such as a NAND flash memory and a phase-change random access memory (PCRAMs) is limited. For example, the number of write operations in a typical PCRAM may be limited to a range of from about $10^6$ to about $10^8$ operations. Accordingly, the life span of a memory device may be drastically reduced when the write operations are concentrated on a specific cell or cell region. To prevent the concentration of the write operations on a specific cell or cell region of a memory device, a wear leveling operation is typically performed to even out the performance of the write operations on all of the cell regions of the memory device. A widely used method for wear leveling achieves a more even allocation of the write operations between all of the cell regions of the memory device by changing the address mapping between logical and physical addresses.

Memory devices may include a plurality of memory regions known as memory blocks. When the number of write operations for a memory block exceeds a threshold value or when a memory block has a physical defect then the memory bloc can no longer operate normally and may generate too many errors. Heretofore, typically, such memory blocks are identified as bad memory block and are excluded from any further read and write operations.

SUMMARY

Various embodiments of the present invention are directed to an improved memory device which is capable of using reliably a bad memory block, i.e., without compromising the reliability of the processed data, a memory system including the memory device, and an operation method thereof.

According to some embodiments, a memory device may include a plurality of normal memory blocks; and at least two or more bad memory blocks, wherein data having the same number of bits as data to be stored in a normal memory block and a parity code having the number of bits at least twice greater than that of a parity code to be stored in the normal memory block are stored in a first bad memory block and a second bad memory block among the bad memory blocks.

The first bad memory block and the second bad memory block may be accessed together.

When a K-th page of the first bad memory block, a K-th page of the second bad memory block may be accessed together, K being a positive integer equal to or greater than 1 and equal to or smaller than N, and N being the number of pages in the first bad memory block.

The data and a first parity code for correcting an error of the data may be stored in the K-th page of the first bad memory block, and a second parity code for correcting errors of the data and the first parity code stored in the K-th page of the first bad memory block may be stored in the K-th page of the second bad memory block.

According to further embodiments, an operation method of a memory system may include determining a write operation on bad memory blocks of a memory device; generating a first parity code for correcting an error of information to be stored in a first bad memory block among the bad memory blocks; writing the information in a K-th page of the first bad memory block, wherein K is a positive integer equal to or greater than 1 and equal to or smaller than N, and N is the number of pages in the first bad memory block; and writing the first parity code in a K-th page of a second bad memory block among the bad memory blocks.

The information may include data.

The information may further include a second parity code for correcting an error of the data.

The operation method may further include determining a read operation on the bad memory blocks of the memory device; reading the information from the K-th page of the first bad memory block; reading the first parity code from the K-th page of the second bad memory block; and correcting the error of the information using the first parity code.

The information includes data and a second parity code for correcting an error of the data. The operation method may further include correcting the error of the data using the second parity code after correcting the error of the information.

According to further embodiments, a memory system may include a memory device including a plurality of normal memory blocks and at least two or more bad memory blocks; and a memory controller configured to control the memory device, wherein the memory controller includes: a normal block error correction unit configured to generate a first parity code for correcting an error of data, wherein the first parity code is stored with the data in a first bad memory block among the bad memory blocks; and a bad block error correction unit configured to generate a second parity code for correcting errors of the data and the first parity code, wherein the second parity code is stored in a second bad memory block among the bad memory blocks.

The number of bits of the second parity code may be twice larger than the number of bit of the first parity code.

The memory controller may access the first bad memory block and the second bad memory block together.

When the memory controller accesses a K-th page of the first bad memory block, the memory controller may access a K-th page of the second bad memory block, wherein K is a positive integer equal to or greater than 1 and equal to or smaller than N, and N is the number of pages in the first bad memory block.

The memory controller may further include a normal mapping table configured to map logical memory blocks to the normal memory blocks, wherein one logical memory block is mapped to one normal memory block in the normal mapping table; a bad mapping table configured to map remaining logical memory blocks which are non-mapped in the normal mapping table among the logical memory blocks, to the bad memory blocks, wherein one logical memory block is mapped to at least two bad memory blocks in the bad mapping table; and a bad memory block table configured to store a list of the bad memory blocks.

The memory controller may further include a host interface configured to communicate with a host; a scheduler configured to determine an order of operation to be instructed to the memory device based on requests of the host; a command generator configured to generate a command to be applied to the memory device; a wear leveling unit configured to perform a wear leveling operation of the memory device; and a memory interface configured to communicate with the memory device.

According to further embodiments, an operation method of a memory system may include determining a write operation on bad memory blocks of a memory device; writing data and a first parity code for correcting an error of the data in a first bad memory block among the bad memory blocks; and writing a second parity code for correcting errors of the data and the first parity code in a second bad memory block among the bad memory blocks.

The data and the first parity code may be written in a K-th page of the first bad memory block, and the second parity code may be written in a K-th page of the second bad memory block, wherein K is a positive integer equal to or greater than 1 and equal to or smaller than N, and N is the number of pages in the first bad memory block.

The method may further include determining a read operation on the bad memory blocks of the memory device; reading the data and the first parity code from the first bad memory block; reading the second parity code from the second bad memory block; correcting errors of the data and the first parity code using the second parity code; correcting an error of the data using the first parity code; and transferring error-corrected data.

The data and the first parity code may be read from a K-th page of the first bad memory block, and the second parity code may be read from a K-th page of the second bad memory block, wherein K is a positive integer equal to or greater than 1 and equal to or smaller than N, and N is the number of pages in the first bad memory block.

The number of bits of the second parity code may be twice greater than that of the first parity code.

DETAILED DESCRIPTION

Various embodiments of the present invention will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present disclosure.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1A:
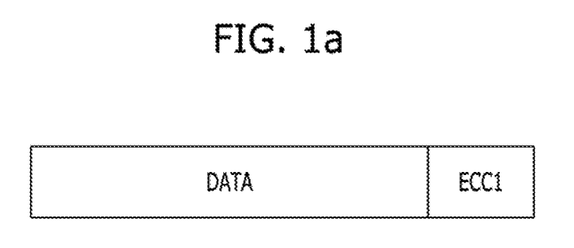
FIGS. 1A and 1B are diagrams illustrating an example of information stored in memory blocks of a memory device, according to an embodiment of the present disclosure.
Figure 1B:
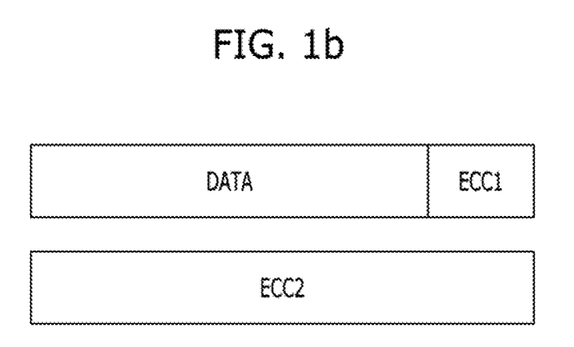

FIGS. 1A and 1B are diagrams illustrating an example of information stored in memory blocks of a memory device, according to, an embodiment of the present disclosure. The memory device may include a plurality of memory blocks and each of the plurality of memory blocks may include a plurality of pages. Herein, the page may be a unit of a read operation and a write operation performed on the memory device. The memory device may be the memory device 330 of FIG. 3. The memory device may include normal and at least two bad memory blocks.

FIG. 1A is a diagram illustrating information stored in one page of a normal memory block of a memory device. Specifically, data DATA and a first parity code ECC1 for correcting an error of the data DATA may be stored in the normal memory block.

FIG. 1B is a diagram illustrating information stored in two pages, each page corresponding to a page of two bad memory blocks of the memory device, i.e., a first bad memory block and a second bad memory block. Data DATA and a first parity code ECC1 for correcting an error of the data DATA may be stored in the first bad memory block like in the normal memory block shown in FIG. 1A. A second parity code ECC2 for correcting errors of the information stored in the first bad memory block, i.e., the information including the data DATA and the first parity code ECC1, may be stored in the second bad memory block.

Since no error occurs or a small amount of error occurs in the normal memory block shown in FIG. 1A, the error of the data DATA may be corrected using only the first parity code ECC1. However, since lots of errors occur in the bad memory block shown in FIG. 1B, both of the first parity code ECC1 and the second parity code ECC2 are used for error correction. Data DATA having the same number of bits as one normal memory block may be stored in the first and second bad memory blocks. For example, as shown in FIG. 2B, the second parity code ECC2 may have at least twice the bits of the first parity code ECC1. In another example, as shown in FIG. 1B the second parity code ECC2 may have a number of bits corresponding to a sum of the number of bits of the data DATA and the number of bits of the first parity code ECC1.

It is illustrated in FIG. 1A that the first parity code ECC1 is stored in the normal memory block. However, it is noted that it is possible, the first parity code ECC1 may not be stored in the normal memory block and only the data DATA may be stored in the normal memory block.

Also, in another embodiment, in FIG. 1B, the data DATA may be stored only in the first bad memory block of the first and second bad memory blocks of the memory device and only a parity code ECC2 for correcting an error of the data DATA may be stored in the second bad memory block.

Figure 2A:
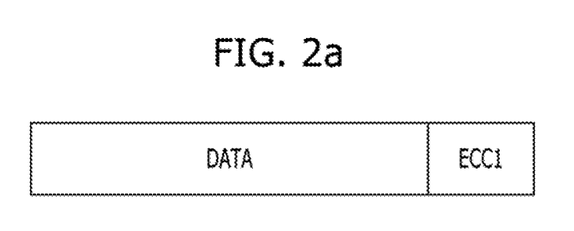
FIGS. 2A and 2B are diagrams illustrating another example of information stored in memory blocks of a memory device, according to an embodiment of the present disclosure.
Figure 2B:
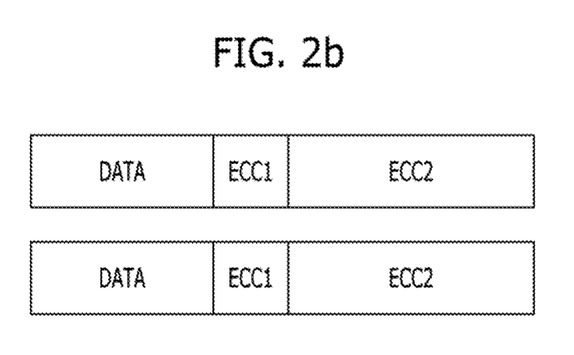

FIGS. 2A and 2B are diagrams illustrating another example of information stored in memory blocks of a memory device, according to an embodiment of the present disclosure.

FIG. 2A is a diagram illustrating information stored in one page of a normal memory block. Specifically, both data DATA and a first parity code ECC1 for correcting an error of the data DATA may be stored in the normal memory block.

FIG. 2B is a diagram illustrating information stored in two pages, each page corresponding to each of two bad memory blocks. Compared to FIG. 1B, where the data DATA and the first parity code ECC1 are stored in the first bad memory block and only the second parity code ECC2 is stored in the second bad memory block, the data DATA, the first parity code ECC1, and the second parity code ECC2 may be divided and stored in the first and second bad memory blocks in FIG. 2B. When the total amounts of information stored in the first and second bad memory blocks are equal to each other, the data DATA, the first parity code ECC1, and the second parity code ECC2 may be stored in any block of the first and second bad memory blocks. So FIGS. 1B and 2B show two different embodiments of using bad memory blocks in pairs in a two-step enhanced error correction method without compromising the reliability of read data. This method will be described in more detail in reference to the remaining Figures.

Figure 3:
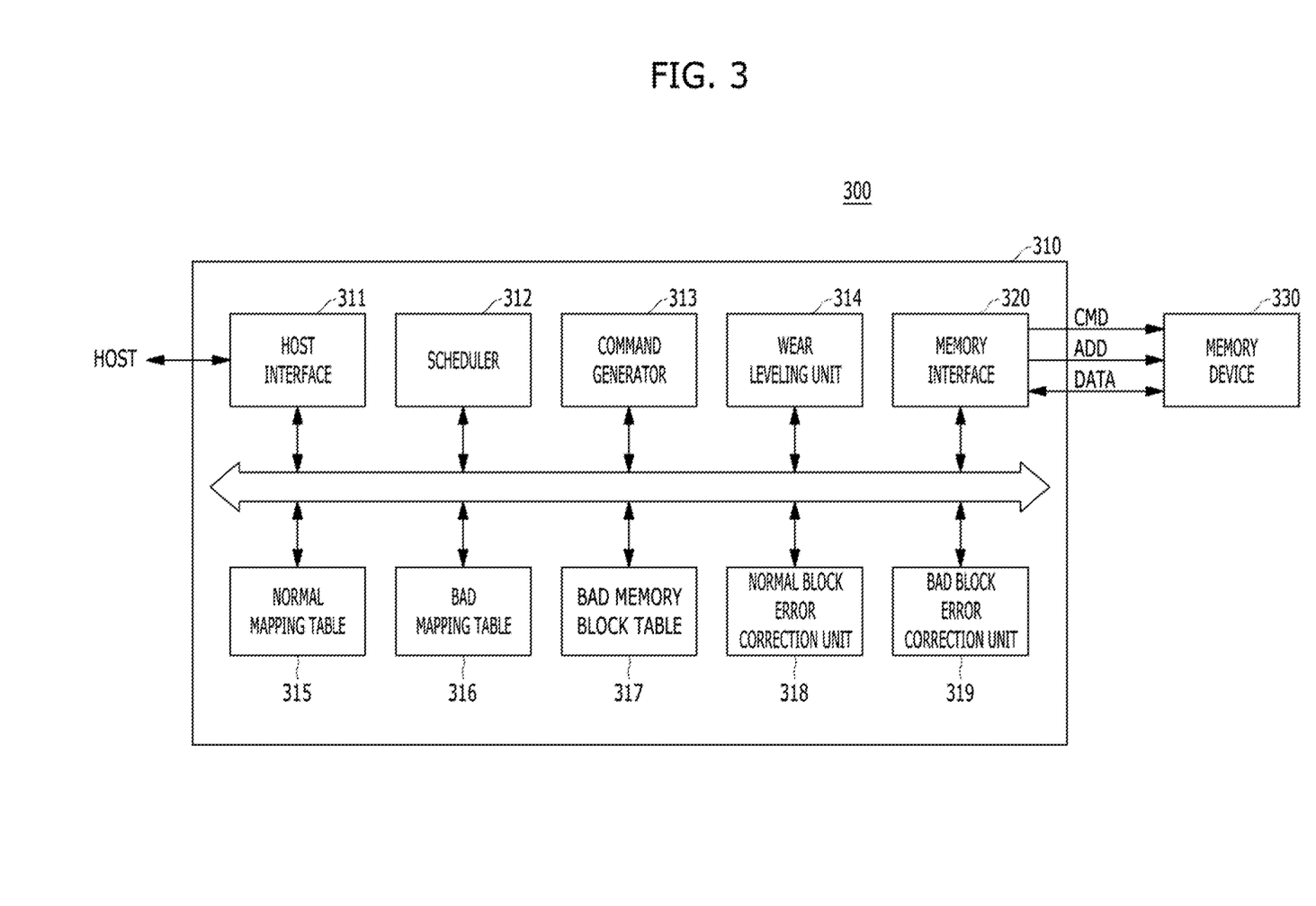
FIG. 3 is a block diagram illustrating a memory system according to an embodiment of the present disclosure.
Figure 4:
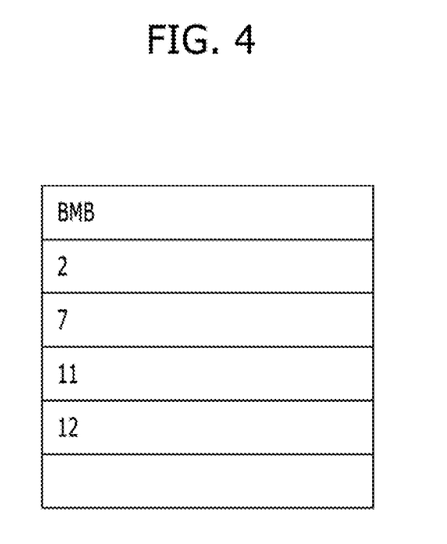
FIG. 4 is a diagram illustrating a bad memory block table shown in FIG. 3.
Figure 5:
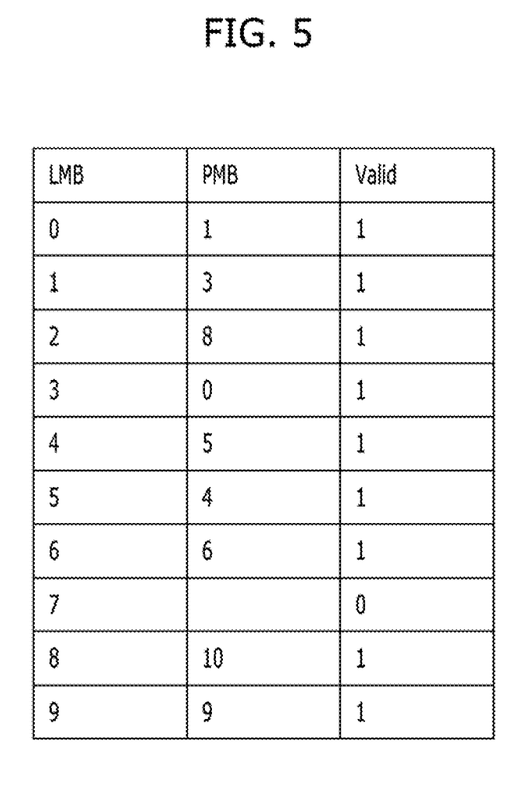
FIG. 5 is a diagram illustrating a normal mapping table shown, in FIG. 3.
Figure 6:
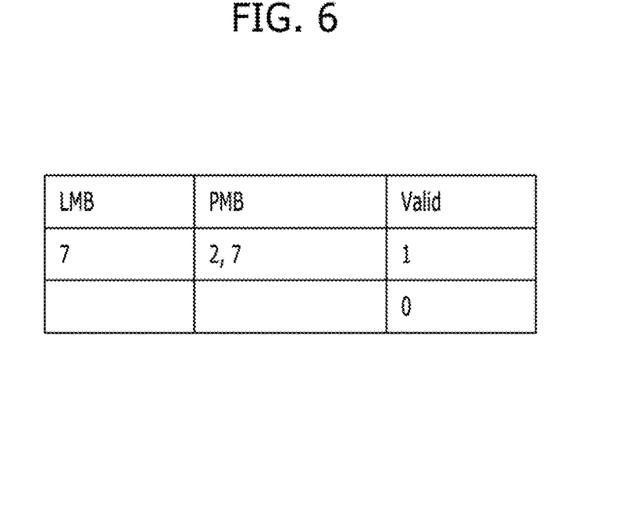
FIG. 6 is a diagram illustrating a bad mapping table shown in FIG. 3.

FIG. 3 is a block diagram illustrating a memory system 300 according to an embodiment of the present disclosure. FIG. 4 is a diagram illustrating a bad memory block table 317 of FIG. 3. FIG. 5 is a diagram illustrating a normal mapping table 315 of FIG. 3. FIG. 6 is a diagram illustrating a bad mapping table 316 of FIG. 3.

Referring to FIG. 3, the memory system 300 may include a memory controller 310 and a memory device 330.

The memory controller 310 may control an operation of the memory device 330 according to a request received from a host HOST. The host HOST may be any suitable processor such as a central processing unit (CPU), a graphic processing unit (GPU), and an application processor (AP) and a controller. The memory controller 310 may include a host interface 311, a scheduler 312, a command generator 313, a wear leveling unit 314, the normal mapping table 315, the bad mapping table 316, the bad memory block table 317, a normal block error correction unit 318, a bad block error correction unit 319, and a memory interface 320.

The host interface 311 may be configured to perform interfacing between the memory controller 310 and the host HOST. The host interface 311 may receive requests from the host HOST and transmit processing results of the requests to the host HOST.

The scheduler 312 may determine an order of operations to be instructed to the memory device 330 based on the requests from the host HOST. The scheduler 312 may set the order of operations to be instructed to the memory device 330 different from the order of the requests received from the host HOST, to improve the performance of the memory device 330. For example, even when the host HOST first requests a read operation of the memory device 330 and then requests a write operation, the scheduler 312 may control the order of operations such that the write operation is preferentially performed before the read operation.

The command generator 313 may generate a command to be applied to the memory device 330 based on the order of operations determined by the scheduler 312.

The memory interface 320 may be configured to perform interfacing between the memory controller 310 and the memory device 330. The memory interface 320 may transmit a command CMD and an address ADD to the memory device 330 from the memory controller 310, and may transmit and receive data DATA between the memory device 330 and the memory controller 310. The memory interface 320 may refer to a physical layer (PHY) interface.

The wear leveling unit 314 may perform a wear leveling operation. The wear leveling operation may be an operation which prevents the life span of the memory device 330 from being reduced due to concentration of the write operations on a specific memory block among the memory blocks of the memory device 330. The wear leveling operation may allow the write operations to be evenly performed on the memory blocks. The wear leveling operations may be performed through a method of changing mapping between logical memory blocks and physical memory blocks periodically or whenever a specific condition is satisfied.

The bad memory block table 317 may store a list of the bad memory blocks among the memory blocks of the memory device 330. The bad memory blocks may include those memory blocks among the memory blocks of the memory device 330 for which the number of occurred errors are equal to or exceed a threshold value. Referring to FIG. 4, for example, second, seventh, eleventh, and twelfth memory blocks among the memory blocks of the memory device 330 are shown as being determined bad memory blocks BMB.

The normal mapping table 315 may be a table configured to map logical memory blocks to physical memory blocks, for example, the memory blocks of the memory device 330. One logical memory block may be mapped to one physical memory block in the normal mapping table 315. Referring to FIG. 5, 0-th to ninth logical memory blocks LMB are shown to be mapped to the physical memory blocks PMB. For example, the 0-th logical memory block. LMB may be mapped to a first physical memory block PMB, the fifth logical memory block LMB may be mapped to a fourth physical memory block PMB. A valid flag Valid may indicate whether or not the mapping is valid. For example, a value of the valid flag Valid of "1." may indicate that a corresponding mapping is valid, whereas a value of "0" may indicate that a corresponding mapping is invalid. It can be seen from the example of FIG. 5 that the seventh logical memory block LMB is not mapped in the normal mapping table 315.

The bad mapping table 316 may be a table configured to map logical memory blocks which are not-mapped in the normal mapping table 315 (i.e., non-mapped memory blocks) among the logical memory blocks, to the bad memory blocks of the memory device 330. One logical memory block may be mapped to at least two bad memory blocks in the bad mapping table 316. FIG. 6 is a diagram illustrating an example of the bad mapping table 316. Referring to FIG. 6, the seventh logical memory block LMB which is not mapped in the normal mapping table 315 is mapped in the bad mapping table 316 to the second and seventh physical memory blocks PMB which are bad memory blocks. A valid flag Valid in FIG. 6 may indicate the mapping validity. For example, a value of the valid flag Valid of "1" may indicate that a corresponding mapping is valid, and a value of the valid flag Valid of "0" may indicate that a corresponding mapping is invalid.

The normal block error correction unit 318 may generate a first parity code ECC1 using the data DATA in the write operation, and correct an error of the data DATA using the first parity code ECC1 in the read operation. The first parity code ECC1 generated by the normal block error correction unit 318 may be stored together with the data DATA in the normal memory block. The first parity code ECC1 may be stored together with the data DATA in one bad memory block of two bad memory blocks which are accessed together. The data DATA and the first parity code ECC1 may be understood with reference to FIGS. 1A to 2B.

The bad block error correction unit 319 may generate a second parity code ECC2 for correcting errors of the data DATA and the first parity code ECC1 using the data DATA and the first parity code ECC1 in the write operation, and may correct the errors of the data DATA and the first parity code ECC1 using the second parity code ECC2 in the read operation. The use of the second parity code ECC2 may be understood with reference to FIGS. 1A to 2B.

The memory device 330 may perform the read operation, the write operation, and the like according to control of the memory controller 310. The memory device 330 may include a plurality of memory blocks. The memory device 330 may be any suitable memory device, for example, a phase-change random access memory (PCRAM), a resistive random-access memory (RRAM), a ferroelectric random-access memory (FRAM), a magnetic random access memory (MRAM), a NAND Flash memory, a dynamic random-access memory (DRAM), and the like.

Figure 7:
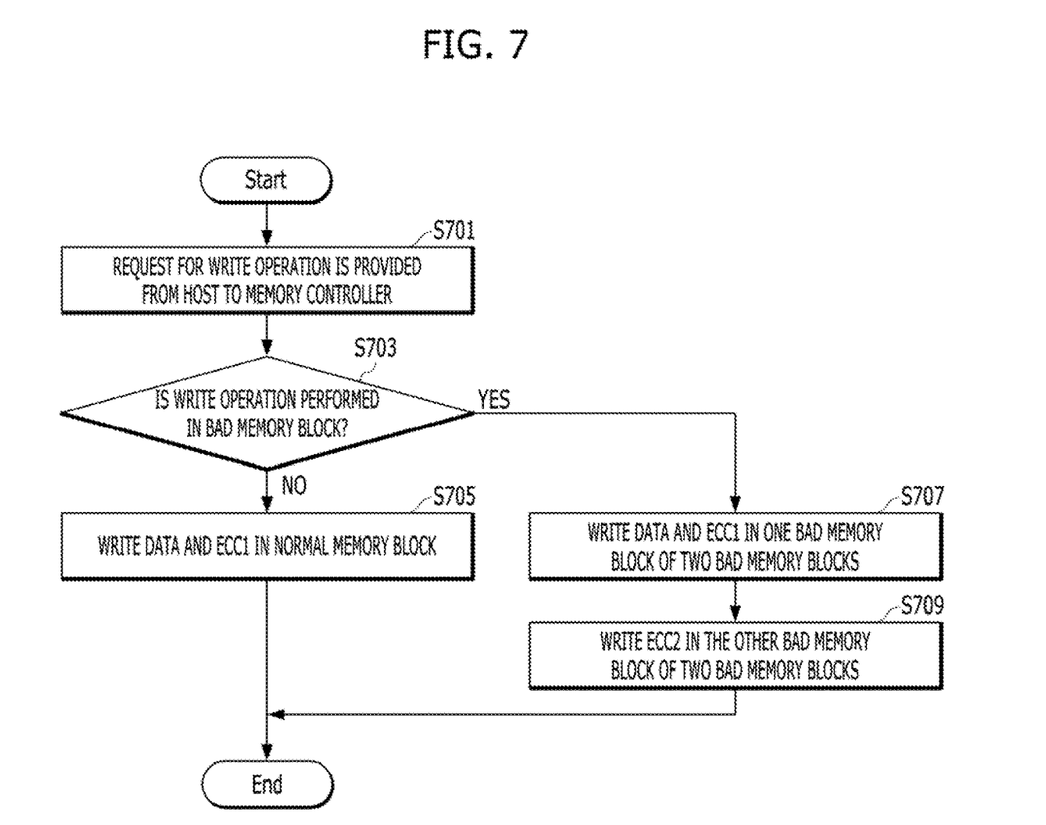
FIG. 7 is a flow chart illustrating a write operation of the memory system shown in FIG. 3 according to an embodiment of the present disclosure.

FIG. 7 is a flow chart illustrating a write operation of the memory system 300 of FIG. 3 according to an embodiment of the present disclosure.

Referring to FIG. 7, a request for a write operation may be provided from the host HOST to the memory controller 310, at step S701. The write request from the host HOST may include information for a logical memory block on which the write operation is to be performed and a page in the logical memory block and write data.

At step S703, it may be determined whether the write operation will be performed on a normal memory block or a bad memory block of the memory device 330. For example, when the logical memory block to which the write operation is requested at step S701 is mapped in the normal mapping table 315, the write operation may be performed on the normal memory block of the memory device 330. For example, based on the normal mapping table 315 of FIG. 5, when the write operation to the second logical memory block is requested, the write operation may be performed on the eighth logical memory block of the memory device 330 which is a normal memory block. When the logical memory block to which the write operation is requested at step S701 is mapped in the bad mapping table 316, the write operation may be performed on the bad memory blocks of the memory device 330. For example, based on the bad mapping table 316 of FIG. 6, when the write operation to the seventh logical memory block is requested, the write operation may be performed on the second and seventh memory blocks of the memory device 330 which are bad memory blocks.

When it is determined that the write operation is to be performed on a normal memory block of the memory device 330 ("NO" of step S703), the data DATA and the first parity code ECC1 generated by the normal block error correction unit 318 may be written in one page of the memory block of the memory device 330 mapped in the normal mapping table 315, at step S705.

When it is determined that the write operation is to be performed on bad memory blocks of the memory device 330 ("YES" of step S703), the scheduler 312 of the memory controller 310 may perform scheduling on the write operation on two bad memory blocks.

First, the data DATA and the first parity code ECC1 generated by the normal block error correction unit 318 may be written in one page of a bad memory block of the two bad memory blocks of the memory device 330 mapped in the bad mapping table 316, at step S707. For example, based on the bad mapping table 316 of FIG. 6, the data DATA and the first parity code ECC1 are written in one page of the second memory block of the second and seventh memory blocks of the memory device 330.

The second parity code ECC2 generated by the bad block error correction unit 319 may be written in one page of the other bad memory block of the two bad memory blocks of the memory device 330 mapped in the bad mapping table 316, at step S709. For example, based on the bad mapping table 316 of FIG. 6, the second parity code ECC2 is written in one page of the seventh memory block of the second and seventh memory blocks of the memory device 330. The same pages may be accessed in the two bad memory blocks which are accessed together. For example, when the write operation is performed on a third page of the second memory block at step S707, the write operation may be performed on a third page of the seventh memory block at step S709.

According to the write method of FIG. 7, the parity code ECC2 having a number of bits in the write operation on the bad memory blocks that is more than that of the parity code ECC1 used in the write operation on the normal memory block may be stored in a page of the bad memory block which is not storing any data. This is to prepare to correct lots of errors which are to occur in the bad memory blocks.

Figure 8:
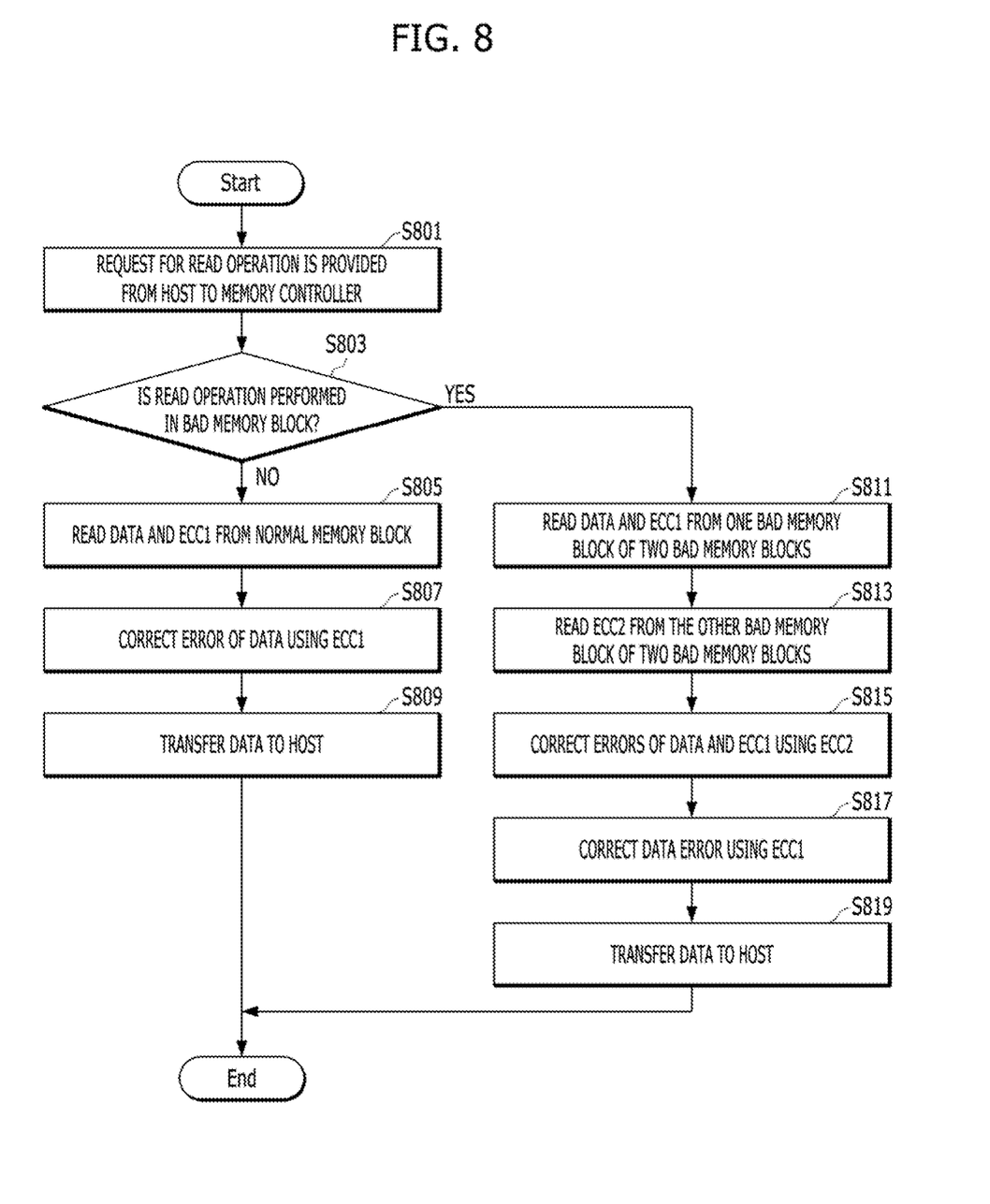
FIG. 8 is a flow chart illustrating a read operation of the memory stem of FIG. 3 according to an embodiment of the present disclosure.

FIG. 8 is a flow chart illustrating a read operation of the memory system 300 of FIG. 3 according to an embodiment of the present disclosure.

Referring to FIG. 8, a request for a read operation may be provided from the host HOST to the memory controller 310, at step S801. The read request received from the host HOST may include information for a logical memory block on which the read operation is to be performed and a page in the logical memory block.

At step S803 it may be determined whether the read operation will be performed on a normal memory block or a bad memory block of the memory device 330. When the logical memory block to which the read operation is requested at step S801 is mapped in the normal mapping table 315, the write operation may be performed on the normal memory block of the memory device 330. For example, based on the normal mapping table 315 of FIG. 5, when a read operation for the second logical memory block is requested, the read operation may be performed on the eighth memory block of the memory device 330 which is a normal memory block. When the logical memory block for which the read operation is requested is mapped in the bad mapping table 316 at step S801, the write operation may be performed on the bad memory blocks of the memory device 330. For example, based on the bad mapping table 316 of FIG. 6, when the read operation to the seventh logical memory block is requested the read operation may be performed on the second and seventh memory blocks of the memory device 330 which are bad memory blocks.

When it is determined that the read operation is to be performed on a normal memory block of the memory device 330 ("No" of step S803), the data DATA and the first parity code ECC1 may be read from one page of the memory block of the memory device 330 mapped in the normal mapping table 315, at step S805.

At step S807, the normal block error correction unit 318 may correct an error of the data DATA using the first parity code ECC1. At step S809, the host interface 311 may transmit the error-corrected data DATA to the host HOST.

When it is determined that the read operation is to be performed on the bad memory blocks of the memory device 330 ("Yes" of step S803), the scheduler 312 of the memory controller 310 may schedule performing the read operation on two bad memory blocks.

First, the data DATA and the first parity code ECC1 may be read from one page of one bad memory block of the two bad memory blocks of the memory device 330 mapped in the bad mapping table 316, at step S811. For example, based on the bad mapping table 316 of FIG. 6, the data DATA and the first parity code ECC1 are read from one page of the second memory block of the second and seventh memory blocks of the memory device 330.

The second parity code ECC2 may be read from one page of the other bad memory block of the two bad memory blocks of the memory device 330 mapped in the bad mapping table 316, at step S813. For example, based on the bad mapping table 316 of FIG. 6, the second parity code ECC2 is read from one page of the seventh memory block of the second and seventh memory blocks of the memory device 330 which are mapped to the seventh logical memory block in the bad mapping table 316 of FIG. 6. The same pages may be accessed in the two bad memory blocks which are accessed together. For example, when the read operation is performed on a third page of the second memory block at step S811, the read operation may be performed on a third page of the seventh memory block at step S813.

At step S815, the bad block error correction unit 319 may correct errors of the data DATA and the first parity code ECC1 using the second parity code ECC2. At step S817, the normal block error correction unit 318 may correct the error of the data DATA using the first parity code ECC1. At step S819, the host interface 311 may transmit the error-corrected data DATA to the host HOST.

According to the read method of FIG. 8, errors may be corrected by a two-step error correction in the read operation on the bad memory blocks. Accordingly, since the errors may be subjected to a stronger, more reliable correction method during the read operation on the bad memory blocks, the bad memory blocks may be used even when lots of errors may occur in the bad memory blocks.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device including a plurality of normal memory blocks and at least two or more bad memory blocks; and
   a memory controller configured to control the memory device,
   wherein the memory controller includes:
   a normal block error correction unit configured to generate a first parity code for correcting an error of data, wherein the first parity code is stored with the data in a first bad memory block among the bad memory blocks;
   a bad block error correction unit configured to generate a second parity code for correcting errors of the data and the first parity code, wherein the second parity code is stored in a second bad memory block among the bad memory blocks;
   a normal mapping table configured to map logical memory blocks to the normal memory blocks, wherein one logical memory block is mapped to one normal memory block in the normal mapping table;
   a bad mapping table configured to map remaining logical memory blocks which are non-mapped in the normal mapping table among the logical memory blocks, to the bad memory blocks, wherein one logical memory block is mapped to at least two bad memory blocks in the bad mapping table; and
   a bad memory block table configured to store a list of the bad memory blocks.

2. The memory system of claim 1, wherein the number of bits of the second parity code is twice greater than that of the first parity code.

3. The memory system of claim 1, wherein the memory controller accesses the first bad memory block and the second bad memory block together.

4. The memory system of claim 3, wherein, when the memory controller accesses a K-th page of the first bad memory block, the memory controller accesses a K-th page of the second bad memory block, wherein K is a positive integer equal to or greater than 1 and equal to or smaller than N, and N is the number of pages in the first bad memory block.

5. The memory system of claim 1, wherein the memory controller further includes:
   a host interface configured to communicate with a host;
   a scheduler configured to determine an order of operation to be instructed to the memory device based on requests of the host;
   a command generator configured to generate a command to be applied to the memory device;
   a wear leveling unit configured to perform a wear leveling operation of the memory device; and
   a memory interface configured to communicate with the memory device.

* * * * *